(12) United States Patent
Karunaratne et al.

(10) Patent No.: US 12,050,977 B2
(45) Date of Patent: Jul. 30, 2024

(54) REPRESENTATION OF AN ORDERED GROUP OF SYMBOLS BY HYPERVECTORS

(71) Applicant: International Business Machines Corporation, Armonk, NY (US)

(72) Inventors: Kumudu Geethan Karunaratne, Gattikon (CH); Abbas Rahimi, Zurich (CH); Manuel Le Gallo-Bourdeau, Zurich (CH); Giovanni Cherubini, Rueschlikon (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 735 days.

(21) Appl. No.: 17/331,763

(22) Filed: May 27, 2021

(65) Prior Publication Data

US 2022/0383063 A1 Dec. 1, 2022

(51) Int. Cl.
*H03M 7/00* (2006.01)
*G06F 17/16* (2006.01)
(Continued)

(52) U.S. Cl.
CPC .............. *G06N 3/04* (2013.01); *G06F 17/16* (2013.01); *G06N 3/063* (2013.01); *H03M 7/00* (2013.01); *G06F 5/01* (2013.01)

(58) Field of Classification Search
CPC ......... H03M 13/1162; H03M 13/6508; H03M 3/322; H03M 1/002; H03M 1/201; H03M 13/1105; H03M 13/116; H03M 13/2775; H03M 13/296; H03M 13/6325; H03M 13/6513; H03M 13/6569; H03M 13/6577; H03M 13/15; H03M 13/1165; H03M 13/19; H03M 13/255; H03M 13/27; H03M 13/2703; H03M 13/271; H03M 13/2792; H03M 13/2957; H03M 13/356;
(Continued)

(56) References Cited

U.S. PATENT DOCUMENTS

2019/0130273 A1* 5/2019 Keskar .................... G06F 40/47
2020/0104677 A1* 4/2020 Rae ...................... G06F 16/2272
(Continued)

OTHER PUBLICATIONS

Chang et al., "IP-HDC: Information-Preserved Hyperdimensional Computing for Multi-task Learning", 2020 IEEE, 6 pages.
(Continued)

*Primary Examiner* — Linh V Nguyen
(74) *Attorney, Agent, or Firm* — Monchai Chuaychoo

(57) ABSTRACT

The present disclosure relates to a method for representing an ordered group of symbols with a hypervector. The method comprises sequentially applying on at least part of the input hypervector associated with a current symbol a predefined number of circular shift operations associated with the current symbol, resulting in a shifted hypervector. A rotate operation may be applied on the shifted hypervector, resulting in an output hypervector. If the current symbol is not the last symbol of the ordered group of symbols the output hypervector may be provided as the input hypervector associated with a subsequent symbol of the current symbol; otherwise, the output hypervector of the last symbol of the ordered group of symbols may be provided as a hypervector that represents the ordered group of symbols.

20 Claims, 15 Drawing Sheets

(51) Int. Cl.
*G06N 3/04* (2023.01)
*G06N 3/063* (2023.01)
*G06F 5/01* (2006.01)

(58) Field of Classification Search
CPC ............. H03M 13/41; H03M 13/4169; H03M 13/6362; H03M 13/6552; H03M 13/158; H03M 13/2721; H03M 13/35; H03M 13/413; H03M 1/1245; H03M 13/00; H03M 13/1102; H03M 13/1148; H03M 13/23; H03M 13/31; H03M 13/33; H03M 13/6502; H03M 5/145; H03M 7/3075; H03M 7/4012; G06N 3/063; G06N 3/04; G06N 3/044; G06N 3/045; G06N 3/065; G06N 7/01; G06N 20/10; G06N 3/08; G06N 3/084; G06N 5/04; G06F 15/7821; G06F 17/16; G06F 9/30036; G06F 15/7867; G06F 15/80; G06F 16/9032; G06F 16/90335; G06F 18/211; G06F 18/21345; G06F 18/214; G06F 18/2431; G06F 40/00; G06F 40/284; G06F 40/289; G06F 9/3001; G06F 9/3004; G06F 9/30145; G06F 9/3555; G06F 9/3836; G06F 9/4806; G06F 9/5011
USPC .......................................... 341/51, 106, 107
See application file for complete search history.

(56) References Cited

U.S. PATENT DOCUMENTS

| | | | | |
|---|---|---|---|---|
| 2020/0364578 | A1* | 11/2020 | Jaiswal | G06V 10/82 |
| 2020/0380384 | A1 | 12/2020 | Karunaratne | |
| 2020/0381048 | A1* | 12/2020 | Le Gallo-Bourdeau | G11C 13/0069 |
| 2021/0326756 | A1* | 10/2021 | Khaleghi | G06F 18/211 |
| 2021/0334703 | A1* | 10/2021 | Salamat | G06N 20/00 |
| 2022/0019441 | A1* | 1/2022 | Rosing | G16B 30/10 |
| 2022/0374234 | A1* | 11/2022 | Imani | G06F 15/7821 |
| 2023/0090262 | A1* | 3/2023 | Idelson | G06N 3/082 706/26 |

OTHER PUBLICATIONS

Imani et al., "BRIC: Locality-based Encoding for Energy-Efficient Brain-Inspired Hyperdimensional Computing", DAC 19, Jun. 2-6, 2019, Las Vegas, NV, USA, 6 pages.

Imani et al., "Hierarchical Hyperdimensional Computing for Energy Efficient Classification", DAC '18, Jun. 24-29, 2018, San Francisco, CA, USA, 6 pages.

Imani et al., "Low-Power Sparse Hyperdimensional Encoder for Language Recognition", Submitted to IEEE Design & Test of Computers, Special Issue on Self-Awareness in Systems on Chip, 2017, 6 pages.

Karunaratne et al., "In-memory hyperdimensional computing", arXiv:1906.01548v2 [cs.ET], Apr. 9, 2020, 16 pages.

Khaleghi et al., "SHEARer: Highly-Efficient Hyperdimensional Computing by Software-Hardware Enabled Multifold Approximation", ISLPED '20, arXiv:2007.10330v1 [cs.LG], Jul. 20, 2020, 8 pages.

Liu et al., "HDC-IM: Hyperdimensional Computing In-Memory Architecture based on RRAM", 2019 IEEE, pp. 450-453.

Rahimi et al., "High-Dimensional Computing as a Nanoscalable Paradigm", IEEE Transactions on Circuits and Systems—I: Regular Papers, vol. 64, No. 9, Sep. 2017, pp. 2508-2521.

Rahimi et al., "Hyperdimensional Biosignal Processing: A Case Study for EMG-based Hand Gesture Recognition", IEEE, 2016, 8 pages.

* cited by examiner

REPRESENTATION OF AN ORDERED GROUP OF SYMBOLS BY HYPERVECTORS

BACKGROUND

The invention relates in general to the field of neural network systems and, in particular, to a device for representing of an ordered group of symbols by a hypervector.

Hyper-dimensional computing (HDC) is recognized as one such framework based on the observation that key aspects of human memory, perception, and cognition may be explained by the mathematical properties of hyper-dimensional spaces, and that a powerful system of computing can be built by relying on the rich algebra of hypervectors. However, there is a need for an improved computing model and a related architecture and a related implementation for hyper-dimensional computing with a dimensionality above and/or far above the current limitations of the existing approaches.

SUMMARY

Various embodiments provide a device for representing an ordered group of symbols by a hypervector, system and method as described by the invention of the independent claims. Advantageous embodiments are described in the dependent claims. Embodiments of the present invention can be freely combined with each other if they are not mutually exclusive.

In one aspect, the invention relates to a device for encoding an ordered group of symbols, wherein the device comprises: an input storage configured for storing a randomly initialized seed hypervector; an encoding unit connected to the input storage configured for processing the ordered group of symbols sequentially starting from the first symbol using the stored seed hypervector as an input hypervector associated with the first symbol, the encoding unit being configured for the processing of each symbol of the ordered group of symbols for: applying on at least part of the input hypervector associated with the symbol a predefined number of circular shift operations associated with the symbol, resulting in a shifted hypervector; applying a rotate operation on the shifted hypervector, the applying resulting in an output hypervector, and if the symbol is not the last symbol of the ordered group of symbols storing the output hypervector in the input storage as the input hypervector associated with a subsequent symbol of the symbol in the ordered group; otherwise, providing the output hypervector of the last symbol of the ordered group of symbols as a hypervector that represents the ordered group of symbols.

In another aspect, the invention relates to a system comprising multiple ones of the device, wherein the multiple devices are configured to operate in parallel on respective ordered groups of symbols.

In another aspect, the invention relates to a method for encoding an ordered group of symbols. The method comprises: providing a randomly initialized seed hypervector; processing the ordered group of symbols sequentially starting from a first symbol of the ordered group using the stored seed hypervector as an input hypervector associated with the first symbol, the processing of each symbol comprising: applying on at least part of the input hypervector associated with the symbol a predefined number of circular shift operations associated with the symbol, resulting in a shifted hypervector; applying a rotate operation on the shifted hypervector, the applying resulting in an output hypervector, and if the symbol is not the last symbol of the ordered group of symbols providing the output hypervector as the input hypervector associated with a subsequent symbol of the symbol in the ordered group of symbols; otherwise, providing the output hypervector of the last symbol of the ordered group of symbols as a hypervector that represents the ordered group of symbols.

BRIEF DESCRIPTION OF THE DRAWINGS

In the following embodiments of the invention are explained in greater detail, by way of example only, making reference to the drawings in which.

DETAILED DESCRIPTION

Figures 1A, 1B:
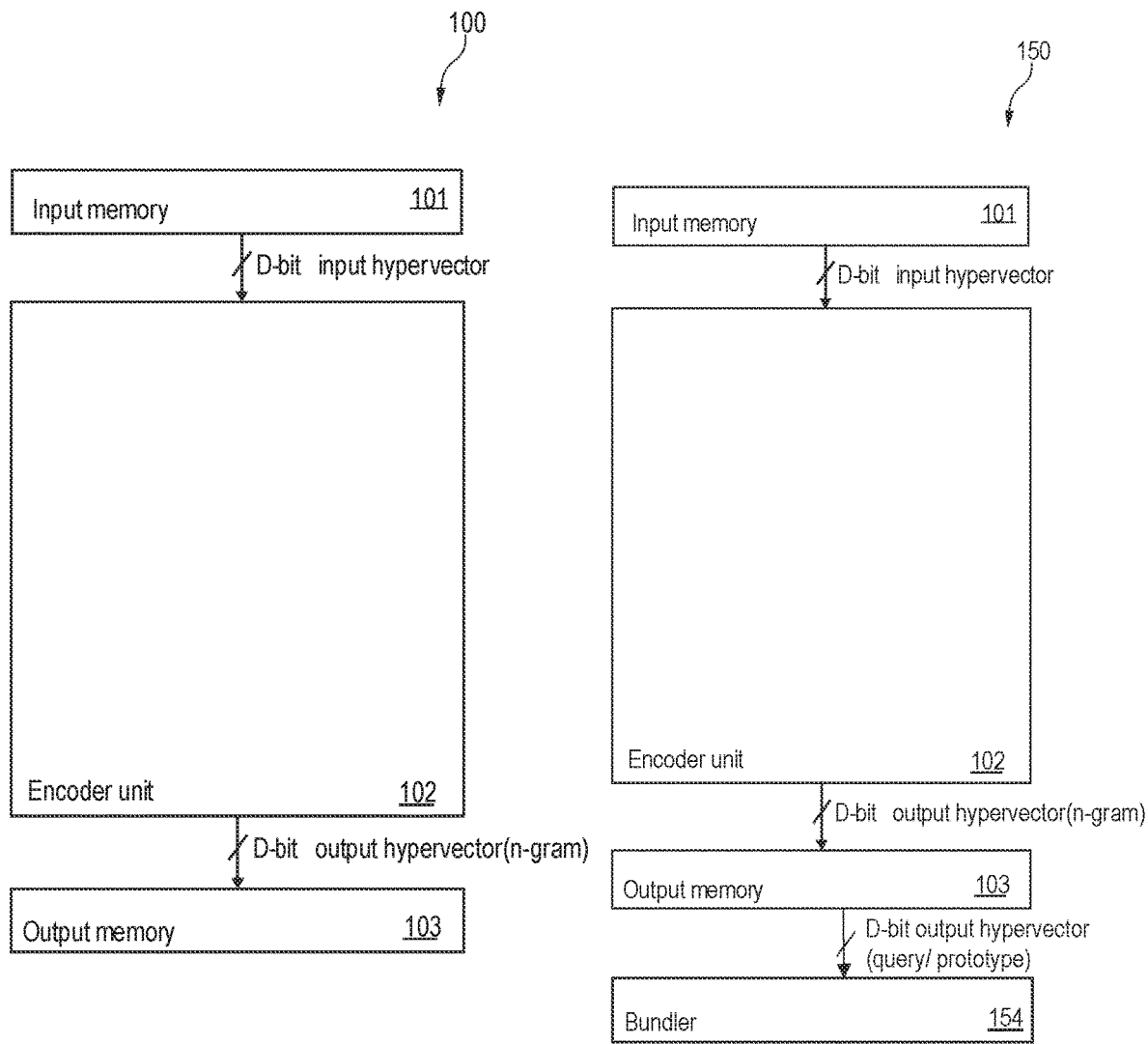
FIG. 1A is a block diagram of a device for representing an ordered group of symbols in accordance with an embodiment of the present invention.
FIG. 1B is a block diagram of a device for representing a sequence of groups of symbols in accordance with an embodiment of the present invention.

The descriptions of the various embodiments of the present invention will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

High-dimensional (HD) computing may be considered a brain-inspired non von Neumann machine learning model based on representing information with high-dimensional vectors named hypervectors. A hypervector may be a vector of bits, integers, real or complex numbers. The hypervector is a vector having a dimension higher than a minimum dimension, e.g., 2000. The hypervectors may thus be advantageous as they may enable a large representational capacity and high robustness. With increasing number of dimensions, the probability of sampling similar vectors by chance may decrease rapidly. If the number of dimensions is high enough, randomly sampled hypervectors are expected to be almost orthogonal. Another advantage of hypervectors may be that they can be used with a variety of devices. Indeed, the hypervectors may be holographic and (pseudo)random with independent and identically distributed (i.i.d) components. The hypervector being holographic means that each bit position in the hypervector may have an equal weight, in contrast to a conventional model with most significant bits and least significant bits. This may imply that a failure in a component of a hypervector is not "contagious". At the same time, failures in a subset of components may be compensated for by the holographic nature of the data representation, e.g., the error-free components can still provide a useful representation that is similar enough to the original hypervector. Hence, using hypervectors may make it possible to adopt noisy, but extremely efficient devices for offloading similarity computations inside a key memory. For example, when unrelated items are represented by nearly orthogonal 10,000-bit hypervectors, more than a third of the bits of a hypervector can be flipped by randomness, device variations, and noise, and the faulty hypervector can still be identified with the correct one, as it is closer to the original error-free vector than to any unrelated vector chosen so far, with near certainty. The HD computing may thus be extremely robust in the presence of failures, defects, variations and noise, and may be very well suited to ultra low energy computation on nanoscale fabrics such as the IBM computational phase-change memory (PCM).

In particular, using the hypervectors may improve machine learning based classification processes compared to traditional classification methods. Classification using traditional von-Neumann approaches may have limitations, e.g., it may involve memory intensive operations contributing to 80% of execution time, quickly forming a bottleneck when implemented in conventional von Neumann architectures (e.g., CPUs and GPUs), especially for tasks demanding thousands to millions of memory entries. In addition, for learning and inference tasks using hypervectors, a HD processor may be composed of three main modules: the encoder, the bundler, and the associative memory (or distance computation module). The encoder generates high dimensional representations for a group of symbols called n-gram. The bundler generates high dimensional representations for a sequence of groups of symbols by accumulating n-gram hypervectors. The associative memory module stores high dimensional representations for classes of symbol sequences. While the associative memory module may be less energy consuming and can be further improved by efficiently mapping it into a computational memory, the encoder may remain more energy consuming and difficult to map into a computational memory array. As the encoder module takes the larger share of overall energy consumption, improvements to the encoding process and its implementation may provide significant energy savings of the overall system. The present invention may have the further advantage of solving this issue by an algorithm and an architecture to efficiently perform HD encoding operations. In particular the HD encoding may be optimized for area efficiency as it may not occupy, as with conventional systems, twice the number of storage elements (for original and complementary basis hypervectors) and store a separate set of channel-bound basis hypervectors for each channel. The present encoding scheme may be designed in an area and energy efficient manner while also maintaining HD-compliance of hypervectors representing n-grams, thus leading to higher classification accuracy.

The device according to the present invention may enable to generate a holographic hypervector that uniquely represents a sequence of symbols. The sequence of symbols may, for example, be an ordered group of symbols e.g., which is analogous to a word in a language. The term "symbol" as used herein may refer to a character or a numerical value. The character may be a number, a letter or any special character. For example, based on the symbol being processed, the device may be configured to perform an iterative application of the circular shifts resulting in a shifted hypervector, followed by one rotation operation (or rotating operation or rotate operation) on the shifted hypervector. The circular shift operation may be a permutation operation. The circular shift operation may, for example, be performed by moving the most right entry of the hypervector to the most left position, while shifting all other entries to the right position or be performed by performing the inverse operation. The circular shift operation may enable a systematic arrangement of the bits while the rotation operation may enable a random arrangement of the bits. The rotation operation may be enabled or performed by a fixed (structured or pseudo-random) shuffling function.

According to one embodiment, the ordered group of symbols is a sequence of characters, which are taken from a subset of an initial set of characters. The encoding unit is configured to associate with each character of the initial set of characters an integer number higher than or equal to zero. The predefined number of circular shift operations associated with each symbol of the ordered group of symbols is this integer number associated with said symbol. The encoding unit is configured to apply the number of circular shift operations on all bits of the input hypervector. Assigning to each character of the characters the number of times the circular shift is to be performed may enable to distinguish between the hypervectors representing different characters. Thus, for some characters, there may be no need to perform the circular shift operation (i.e., their associated integer number is zero) as the rotation operation may be sufficient to distinguish the hypervector of said characters from the other characters. If the integer number is zero for a given character, then the resulting shifted hypervector is the input hypervector of said character. This embodiment may enable to represent, with hypervectors, strings of characters of a text unit such as a paragraph or of a text query, wherein said hypervectors may be used, e.g., for computing similarities with hypervectors of other strings.

According to one embodiment, the encoding unit comprises a lookup table configured for storing the characters and associated integer numbers, and a selector that is configured to receive a character of the ordered group of characters and to select the integer number associated with the character from the lookup table. For example, for each character of the ordered group of characters being processed by the encoding unit, the character may first be received at the selector in order to obtain the integer number associated with it. Said integer number indicates to the encoding unit how many times the circular shift operation is to be performed.

According to one embodiment, the ordered group of symbols is an ordered group of numerical values. The numerical values may, for example, be float or integer values. By contrast to the characters, the numerical values may also differ by the level of the value they represent, e.g., character "c" is different in the same way from, i.e., quasi-orthogonal to, character "a" or "z", while although "0.1" is different from 0.2 and 0.3, it is closer to 0.2 than 0.3. Therefore, the presentation of the numerical values of the ordered group of numerical values, according to this embodiment, may take into account also the level of the numerical value being processed. For that, the encoding unit is configured to associate with each numerical value of a set of numerical values an indication of bits to be shifted, wherein the encoding unit is configured to apply the circular shift operation on the predefined indicated bits of the input hypervector associated with the symbol. For example, if the hypervector comprises D bits $bit_1$, $bit_2$ ... $bit_D$, a given numerical value may be associated with an indication of bit positions, e.g., of $bit_2$ and $bit_4$, so that when the encoding unit is processing the given character it may perform the circular shift on the bits $bit_2$ and $bit_4$ i.e., the shift is prevented for the bits $bit_1$, $bit_3$ and $bit_5$ to $bit_D$. The number of bits in which the shift is prevented is proportional to the numerical value. The numerical values may, for example, be monitoring values of electromyography (EMG) signals.

According to one embodiment, the encoding unit is configured to associate with each character of the set of characters a masking vector indicative of the bits to be shifted, and to apply the circular shift operation with the masking vector associated with the numerical value so that it allows the shift operation of the indicated bits of the input hypervector. The masking vector may be a hypervector of the same size as the input hypervector. Using a masking vector may enable a simplified and efficient implementation of the circular shift operations.

According to one embodiment, the input storage is a register array that is configured so that the values of the hypervector are hardcoded. This embodiment may be advantageous, it may not be required to move any data from the register array for applying the operations. Instead, the circular shift and rotation operations may be performed directly in the storage. This may further increase the energy efficiency because the data movement may be limited to a bare minimum. Thus, according to one embodiment, the encoding unit is configured to store the shifted hypervector in the input storage or in another storage of the device.

According to one embodiment, the initial seed hypervector may be a 50% or less dense binary equiprobable seed hypervector, preferably less than 1% dense binary seed hypervector. Having different sparsity may allow to simplify the subsequent bundling operation to a component wise logical OR operation. For example, the value 50% may be used for dense representations and value 1% may be used for sparse representations.

The generated hypervectors according to the present invention may, for example, be further processed using different hardware modules which are adapted to process hypervectors. For example, a memristive crossbar array may be used to process the generated hypervectors e.g., for arithmetic computation, pattern comparison etc.

According to one embodiment, the ordered group of symbols is a group of a sequence of ordered groups of symbols, wherein the device is configured to repeat the method of generating the hypervector for further remaining ordered groups of symbols of the sequence. The device may further comprise a bundler module configured for accumulating these hypervectors representing the sequence of ordered groups of symbols. In another example, the device may further comprise a distance module configured for computing a distance between the hypervectors representing the sequence of ordered groups of symbols.

According to one embodiment, a system comprises multiple devices of the previous embodiment, wherein the multiple devices are configured to operate in parallel on respective ordered groups of symbols. These multiple devices may, for example, perform encoding on multiple numerical data streams in parallel.

The system further comprises a distance module configured for computing a distance between the hypervectors representing the sequence of ordered groups of symbols. The system further comprises an adder unit configured for adding the respective hypervectors of the multiple devices.

Figure 2:
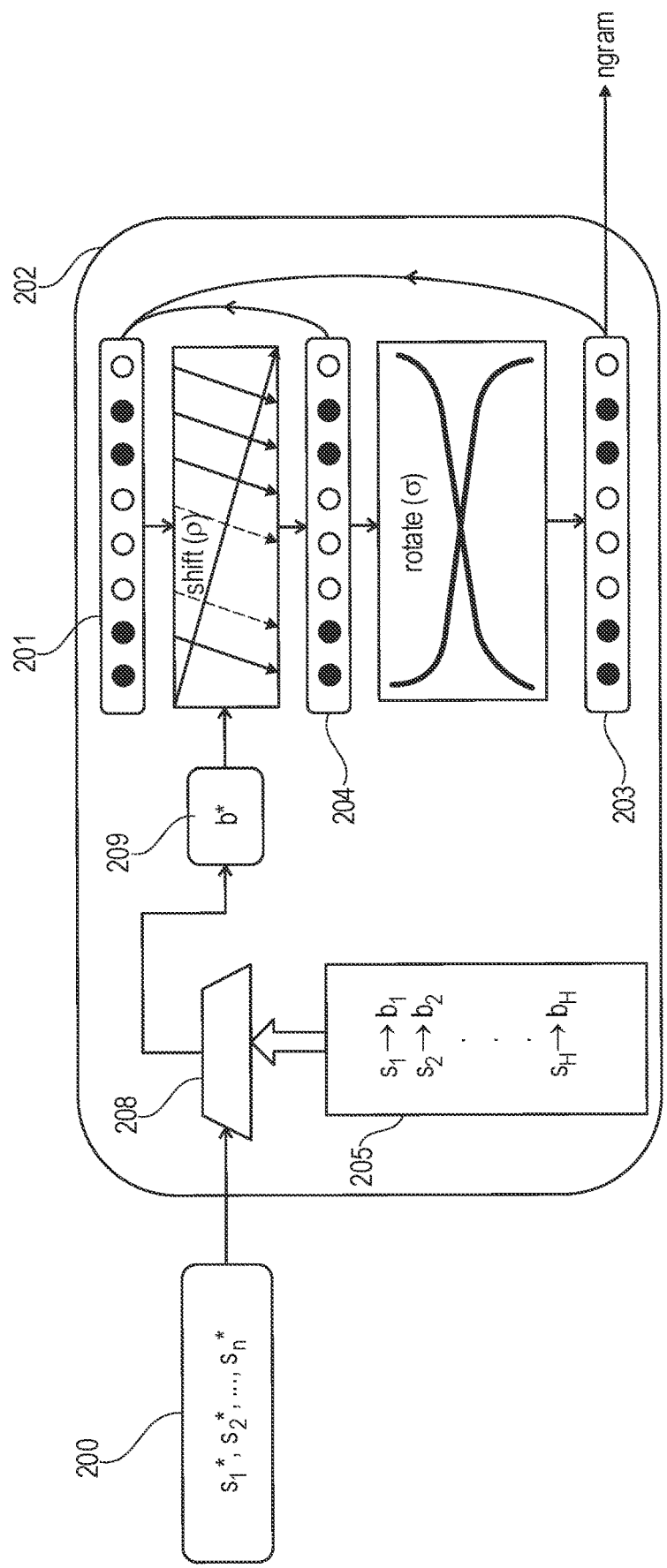
FIG. 2 is a block diagram of a device for representing an ordered group of symbols in accordance with an embodiment of the present invention.
Figure 3:
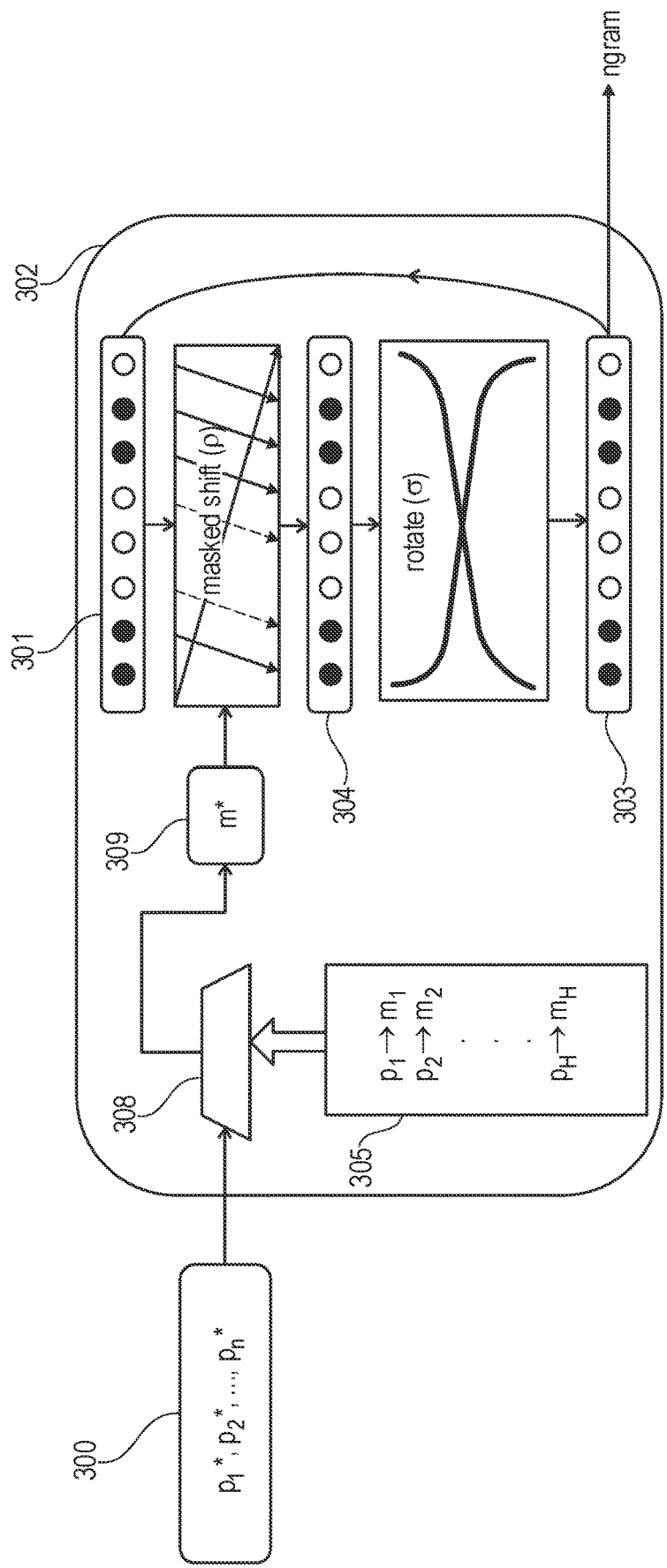
FIG. 3 is a block diagram of a device for representing an ordered group of numerical values in accordance with an embodiment of the present invention.

FIG. 1A shows a block diagram of a device 100 for representing an ordered group of symbols in accordance with an example of the present invention. The device 100 comprises an input storage or input memory 101 for storing an input hypervector, and an encoding (or encoder) unit 102 in connection with input memory 101. The encoding unit 102 is configured for forming an output hypervector for representing, for example, an ordered group of symbols. The device 100 further comprises an output storage or output memory 103 that is configured for storing an n-gram output hypervector, in particular for storing the output hypervector that represents the ordered group of symbols. The encoding unit 102 is configured to sequentially process an ordered group of symbols. The encoding unit 102 is configured to generate for a current symbol of the ordered group of symbols an output hypervector (named intermediate output hypervector) that represents a subsequence of the ordered group of symbols, wherein the subsequence includes the current symbol as the last symbol. The current intermediate output hypervector may be provided as an input hypervector of a subsequent symbol of the current symbol, or as the (final) output hypervector that represents the ordered group of symbols if the current symbol is the last symbol of the ordered group of symbols. The encoding unit 102 is configured to generate an intermediate output hypervector for each symbol of the ordered group of symbols using a sequence of shift and rotation operations associated with said symbol. Although shown as separate components, the encoding unit 102 may, in another example, comprise the input memory 101 and/or the output memory 103. FIGS. 2 and 3 provide example implementations of the encoding units.

FIG. 1B shows a block diagram of a device 150 for representing a sequence of a plurality of ordered groups of symbols in accordance with an example of the present invention. For example, one ordered group of symbols may be a word in a language and the sequence of the plurality of ordered groups of symbols may be a sentence or paragraph in the language. The device 150 comprises the same input storage or input memory 101 for storing an input hypervector, and the same encoding (or encoder) unit 102 in connection with input memory 101, the same output storage or output memory 103 that is configured for storing an n-gram output hypervector. The device 150 further comprises a bundler 154 that accumulates n-gram output hypervectors that represent the plurality of ordered groups of symbols respectively e.g., each n-gram hypervector represents one respective ordered group of symbols. The bundler 154 produces a D-bit hypervector which is called a query hypervector during inference and prototype hypervector during training, e.g., the query hypervector represents the paragraph or sentence.

FIG. 2 shows a block diagram of an encoding unit 202 for representing an ordered group of symbols $s_1^*, s_2^* \ldots s_n^*$ in accordance with an example of the present invention. The encoding unit 202 comprises an input memory 201, a memory 204 named an intermediate memory and an output memory 203. The encoding unit 202 comprises a lookup table 205 storing a set of symbols $s_1$ to $s_H$ in association with indices $b_1$ to $b_H$ respectively. The indices $b_1$ to $b_H$ may be integer numbers. The encoding unit 202 further comprises a selector 208. The encoding unit 202 is configured to generate a hypervector representation of an ordered group of n characters 200. The ordered group of n characters $s_1^*, s_2^* \ldots s_n^*$ 200 may be taken from a subset of the set of characters $s_1$ to $s_H$ stored in the lookup table 205. The encoding unit 202 is configured to process sequentially the ordered group of characters 200. For example, the ordered group of characters comprises character $s_1^*$ followed by $s_2^*$ which is followed by $s_3^*$ and so on. The encoding unit 202 may thus process first the character $s_1^*$ followed by $s_2^*$ etc. and $s_n^*$ is the last character to be processed.

The input memory 201 may be initialized with a randomly initialized seed hypervector. This seed hypervector may be referred to as the input hypervector of the first character $s_1^*$. Upon receiving the character $s_1^*$ at the selector 208, the selector 208 may select from the lookup table 205 the integer number $b_1^*$ 209 that is associated with the received character $s_1^*$. Knowing the integer number 209, the encoding unit 202 may be configured to perform the circular shift operation a number of times equal to said integer number 209 followed by a rotation operation. Assuming, for example, that said integer number $b_1^*$ is 2. The first circular shift operation may be performed on the seed hypervector. This would result in a first shifted hypervector that may be stored in the intermediate memory 204. The first shifted hypervector may be stored in the input memory 201 so that the second circular shift operation may be applied on the first shifted hypervector. This may also result in a second shifted hypervector that may be stored in the intermediate memory 204. Since the number of times to apply the circular shift operations is two, in this example, the following rotation operation may be applied on the second shifted hypervector. This may result in an output hypervector that may be stored in the output memory 203. The output hypervector may further be stored in the input memory 201 as an input hypervector associated with the subsequent symbol $s_2^*$. As with the symbol $s_1^*$, upon receiving the symbol $s_2^*$ at the selector 208, the selector 208 may select from the lookup table 205 the integer number $b_2^*$ 209 that is associated with the received symbol $s_2^*$. Knowing the integer number $b_2^*$ 209, the encoding unit 202 may be configured to perform the circular shift operation a number of times equal to said integer number $b_2^*$ followed by a rotation operation. Assuming, for example, that said integer number $b_2^*$ is 1. The single circular shift operation may be performed on the input hypervector associated with the symbol $s_2^*$. This would result in a shifted hypervector that may be stored in the intermediate memory 204. Since the number of times to apply the circular shift operations is one, in this example, the following rotation operation may be applied on the shifted hypervector. This may result in an output hypervector that may be stored in the output memory 203. The output hypervector may further be stored in the input memory 201 as an input hypervector associated with the subsequent symbol $s_3^*$ and so on. The output hypervector of the last symbol $s_n^*$ may be provided as the hypervector that represents the ordered group of characters 200. This output hypervector is indicated by the term "ngram".

FIG. 3 shows a block diagram of an encoding unit 302 for representing an ordered group of numerical values in accordance with an example of the present invention. The encoding unit 302 comprises an input memory 301, a memory 304 named an intermediate memory and an output memory 303. The encoding unit 302 comprises a lookup table 305 storing a set of numerical values $p_1$ to $p_H$ in association with masking vectors $m_1$ to $m_H$ respectively. The encoding unit 302 further comprises a selector 308. The encoding unit 302 is configured to generate a hypervector representation of an ordered group of numerical values 300. The ordered group of n numerical values $p_1^*, p_2^* \ldots p_n^*$ 300 may be taken from a subset of the set of numerical values $p_1$ to $p_H$ stored in the lookup table 305. The encoding unit 302 is configured to process sequentially the ordered group of numerical values 300. For example, the ordered group of numerical values comprises value $p_1^*$ followed by $p_2^*$ and so on. The encoding unit 302 may thus process first the value $p_1^*$ followed by $p_2^*$ etc. and $p_n^*$ is the last value to be processed.

The input memory 301 may be initialized with a randomly initialized seed hypervector. This seed hypervector may be referred to as the input hypervector of the first numerical value $p_1^*$. Upon receiving the numerical value $p_1^*$ at the selector 308, the selector 308 may select from the lookup table 305 the masking vector $m_1^*$ 309 that is associated with the received numerical value $p_1^*$. The encoding unit 302 may be configured to perform one circular shift operation with the masking vector $m_1^*$ followed by a rotation operation. This may result in a shifted hypervector that may be stored in the intermediate memory 304. The following rotation operation may be applied on the shifted hypervector. This may result in an output hypervector that may be stored in the output memory 303. The output hypervector may further be stored in the input memory 301 as an input hypervector associated with the subsequent numerical value $p_2^*$. As with the numerical value $p_1^*$, upon receiving the numerical value $p_2^*$ at the selector 308, the selector 308 may select from the lookup table 305 the masking vector $m_2^*$ 309 that is associated with the received numerical value $p_2^*$. The encoding unit 302 may be configured to perform the circular shift operation with the masking vector $m_2^*$ followed by a rotation operation. This may result in an output hypervector that may be stored in the output memory 303. The output hypervector may further be stored in the input memory 301 as an input hypervector associated with the subsequent numerical value $p_3^*$ and so on. The output hypervector of the last numerical value $p_n^*$ may be provided as the hypervector that represents the ordered group of numerical values 300. This is indicated by the term "ngram".

Hence, in the case of numerical data, the shift operation is performed only once for each numerical value ($p_1^*, p_2^* \ldots p_n^*$) with a masking vector that prevents the shift operation of certain components, depending on the input. The number of components in which the shift is prevented is proportional to the numerical value (4) that is encoded at the i-th position. The rotate operation remains unchanged.

Figure 4:
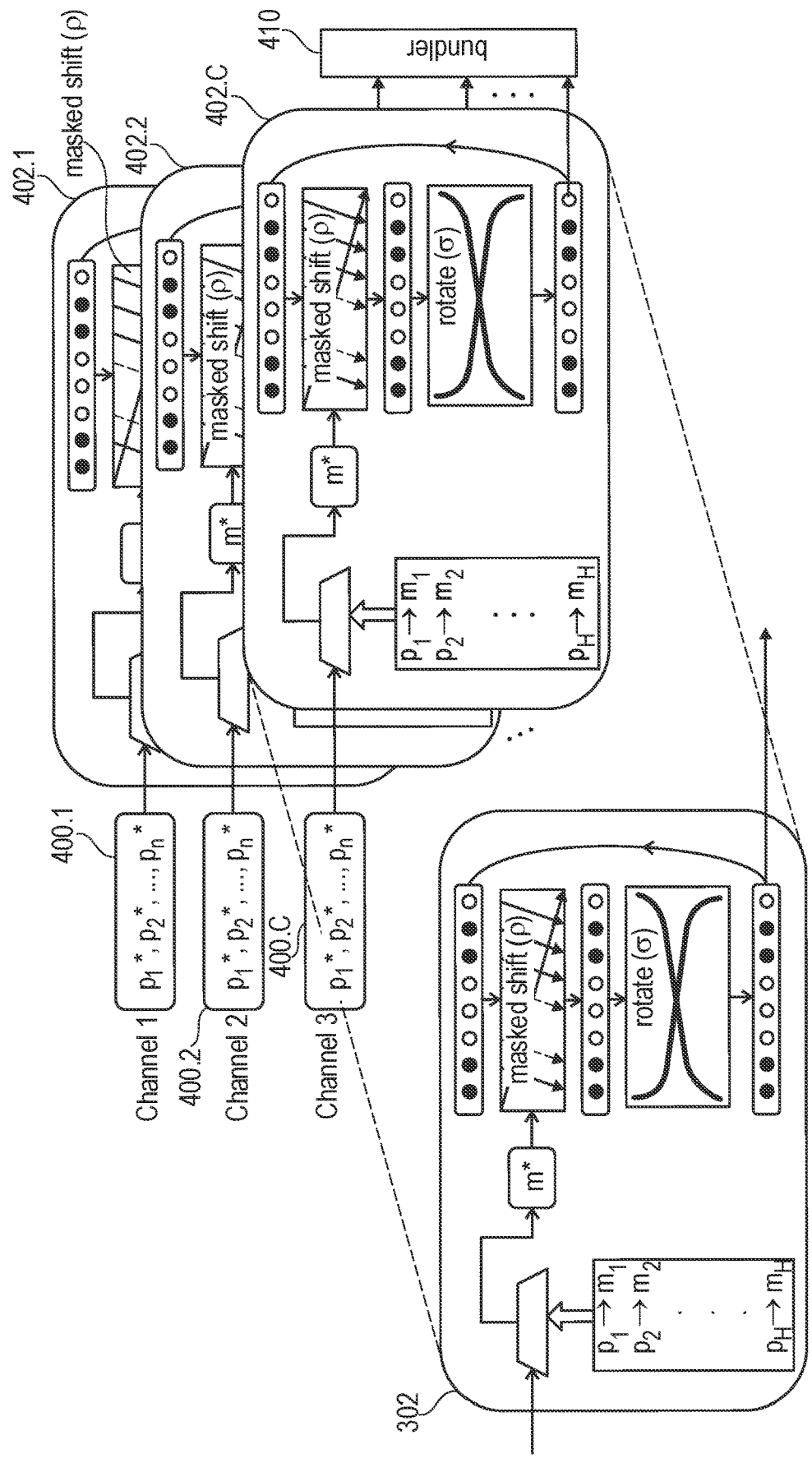
FIG. 4 depicts a system of devices for representing an ordered group of numerical values in accordance with an embodiment of the present invention.

FIG. 4 shows a block diagram of a system 400 for representing multiple ordered groups of numerical values in accordance with an example of the present invention. The system 400 comprises multiple devices 402.1 through 402.C, wherein each device of the devices 402.1 through 402.0 may be the encoding unit 302 of FIG. 3. Each device of the devices 402.1 through 402.0 may be configured to represent a respective ordered group of numerical value 400.1 through 400.C. This may result in C output hypervectors which may be fed to a bundler 410 in order to be added together. The bundler 410 may, for example, bundle the output hypervectors using component-wise addition.

Figure 5:
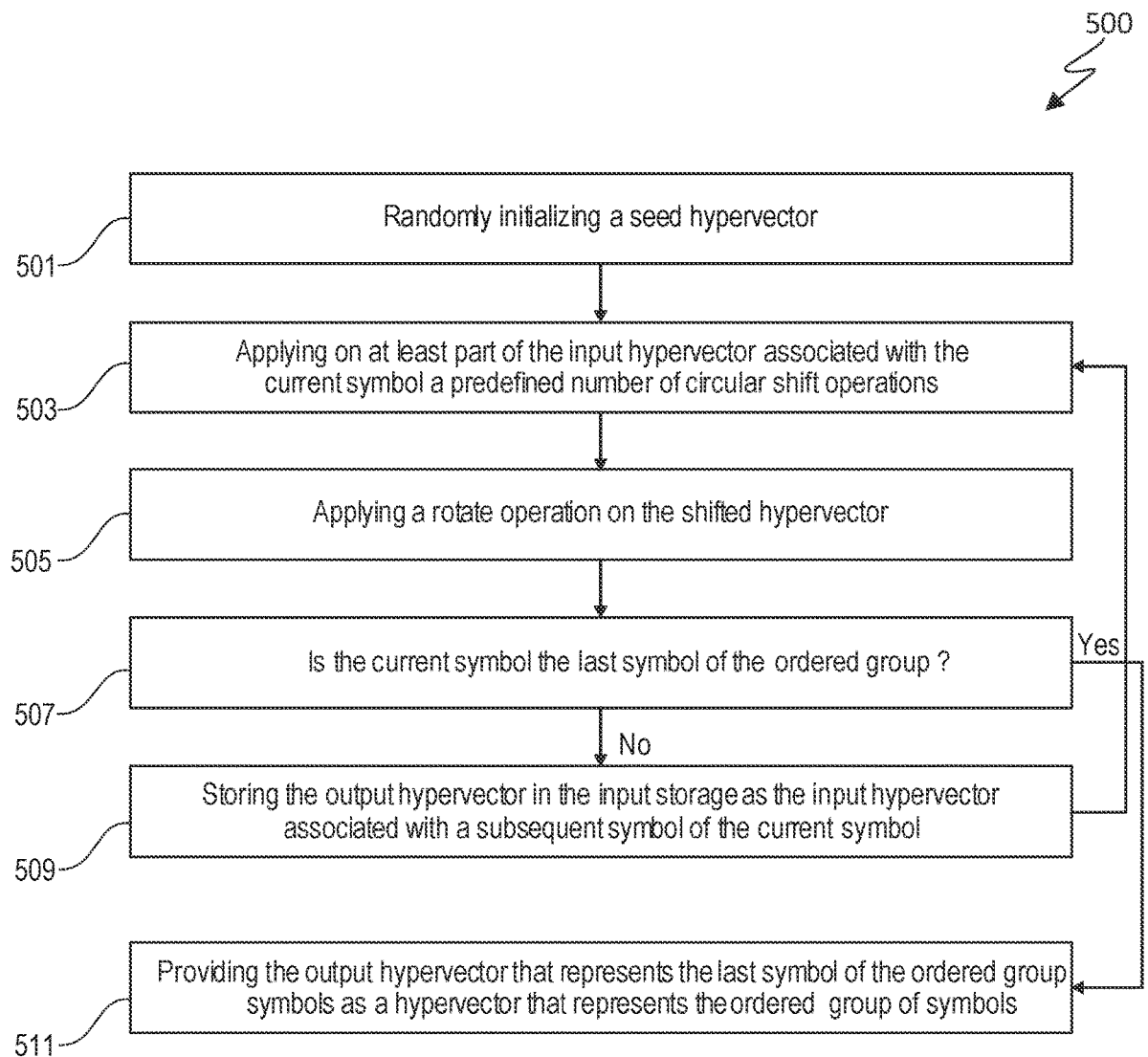
FIG. 5 is a flowchart of a method, designated as process 500, for encoding an ordered group of symbols according to an embodiment of the present invention.

FIG. 5 is a flowchart of a method, designated as process 500, for encoding an ordered group of symbols $s_1^*, s_2^* s_n^*$ according to an example of the present invention. For the purpose of explanation, the method of FIG. 5 may be implemented in the device illustrated in previous FIG. 1, but is not limited to this implementation. For example, the first symbol of the ordered group of symbols may be the symbol $s_1^*$, the second symbol may be the symbol $s_2^*$ and so on. The last symbol of the ordered group of symbols may be the symbol $s_n^*$.

A seed hypervector may randomly be initialized in step 501. The hypervector may comprise D bits, $bit_1, bit_2 \ldots bit_D$. The randomly initialized hypervector may be provided as an input hypervector $IH_1$ associated with the first symbol $s_1^*$.

The ordered group of symbols $s_1^*, s_2^* \ldots s_n^*$ may be processed sequentially starting from the first symbol $s_1^*$, followed by the second symbol $s_2^* \ldots$ and the symbol $s_n^*$ may be the last symbol to be processed. Steps 503 to 511 may be performed sequentially on the ordered group of symbols $s_1^*, s_2^* \ldots s_n^*$.

A predefined number of circular shift operations associated with the current symbol $s_i^*$ (where, i=1, 2 ... n) may be applied on at least part of the input hypervector $IH_i$ associated with the symbol $s_i$ in step 503, resulting in a shifted hypervector $SH_i$. For example, each symbol of the ordered group of symbols may be associated with a number that indicates the number of times the circular shift operation is to be performed when this symbol is being processed. Assuming, for example, that the current symbol is the first symbol $s_1^*$ (i.e., i=1), and the number of times to apply the circular shift operations is m, the application of the first circular shift operation may be performed on the seed hypervector $IH_1$ which may result in a first intermediate shifted hypervector $IMH_1^1$. The application of the second circular shift operation may be performed on the first intermediate hypervector $IMH_1^1$ which may result in a second intermediate shifted hypervector $IMH_1^2$. The application of the third circular shift operation may be performed on the second intermediate hypervector $IMH_1^2$ which may result in a third intermediate shifted hypervector $IMH_1^3$ and so on until it results in the intermediate shifted hypervector $IMH_1^m$ which is the (final) shifted hypervector $SIH_1$ that is obtained after applying the circular shift operation the predefined number of times m.

A rotate operation may be applied in step 505 on the shifted hypervector $SIH_i$. This application may result in an output hypervector $OH_i$ that represents the symbol $s_i^*$.

It may be determined (inquiry step 507) whether the current symbol $s_i^*$ is the last symbol (i.e., i=n). If the current symbol $s_i^*$ is not the last symbol of the ordered group of symbols the output hypervector $OH_i$ may be provided in step 509 as the input hypervector $OH_{i+1}$ associated with a subsequent symbol $s_{i+1}^*$ of the symbol $s_i^*$. If the current symbol $s_i^*$ is the last symbol (i.e., i=n) of the ordered group of symbols the output hypervector $OH_n$ that represents the last symbol of the ordered group of symbols may be provided in step 511 as a hypervector that represents the ordered group of symbols $s_1^*, s_2^* \ldots s_n^*$.

The method of FIG. 5 may be explained in mathematical terms by the following formula:

$$NG = \rho^{bn}(\sigma(\ldots(\rho^{b2}(\sigma(\rho^{b1}(seed\_hv))))))$$

Where seed_hv denotes a 50% dense binary equiprobable seed hypervector of D-dimensions, $y=\rho^{b_t}(x)$; $x \in \{0,1\}^D$, $y \in \{0,1\}^D$, $t \in (1, 2, \ldots, n)$ represents $b_t$ cyclic shifts respectively, and $y=\sigma(x)$; $x \in \{0,1\}^D$, $y \in \{0,1\}^D$ represents a rotating operation, which is a fixed (structured or pseudo-random) shuffling function.

Figure 6A:
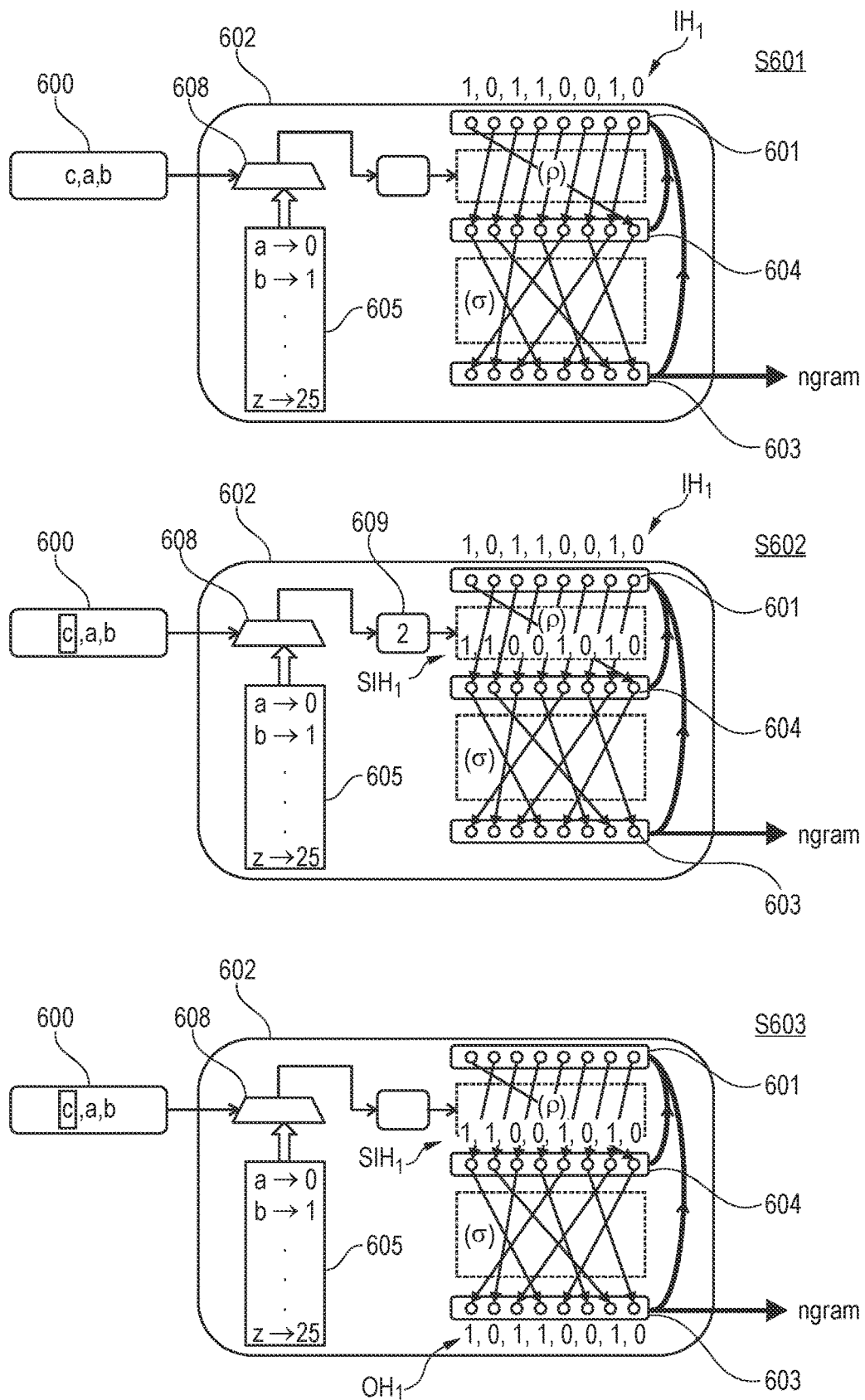
FIGS. 6A-6C shows block diagrams of a device at different stages of processing an ordered group of three characters for representing the ordered group of characters with a hypervector in accordance with an embodiment of the present invention.
Figure 6B:
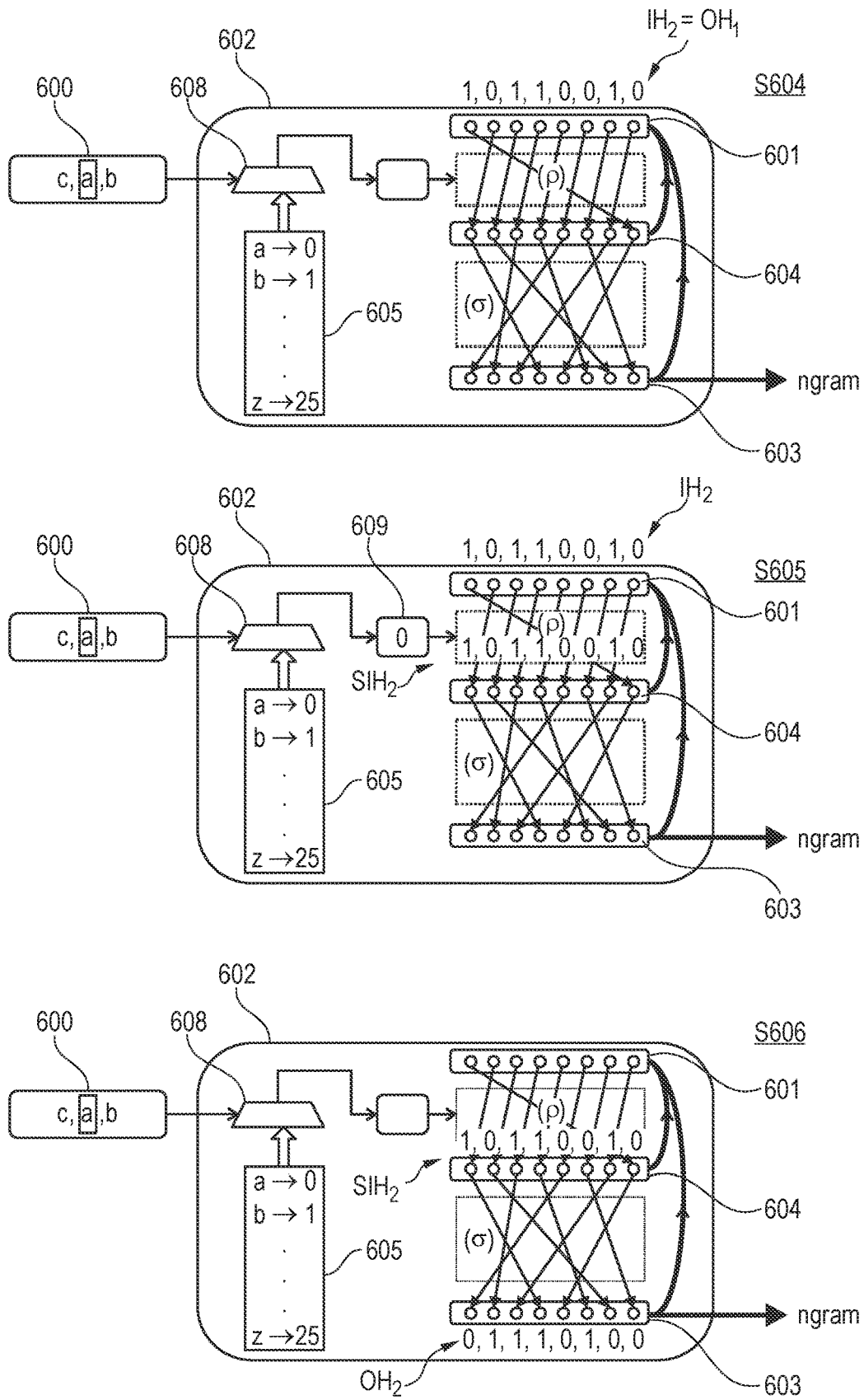
Figure 6C:
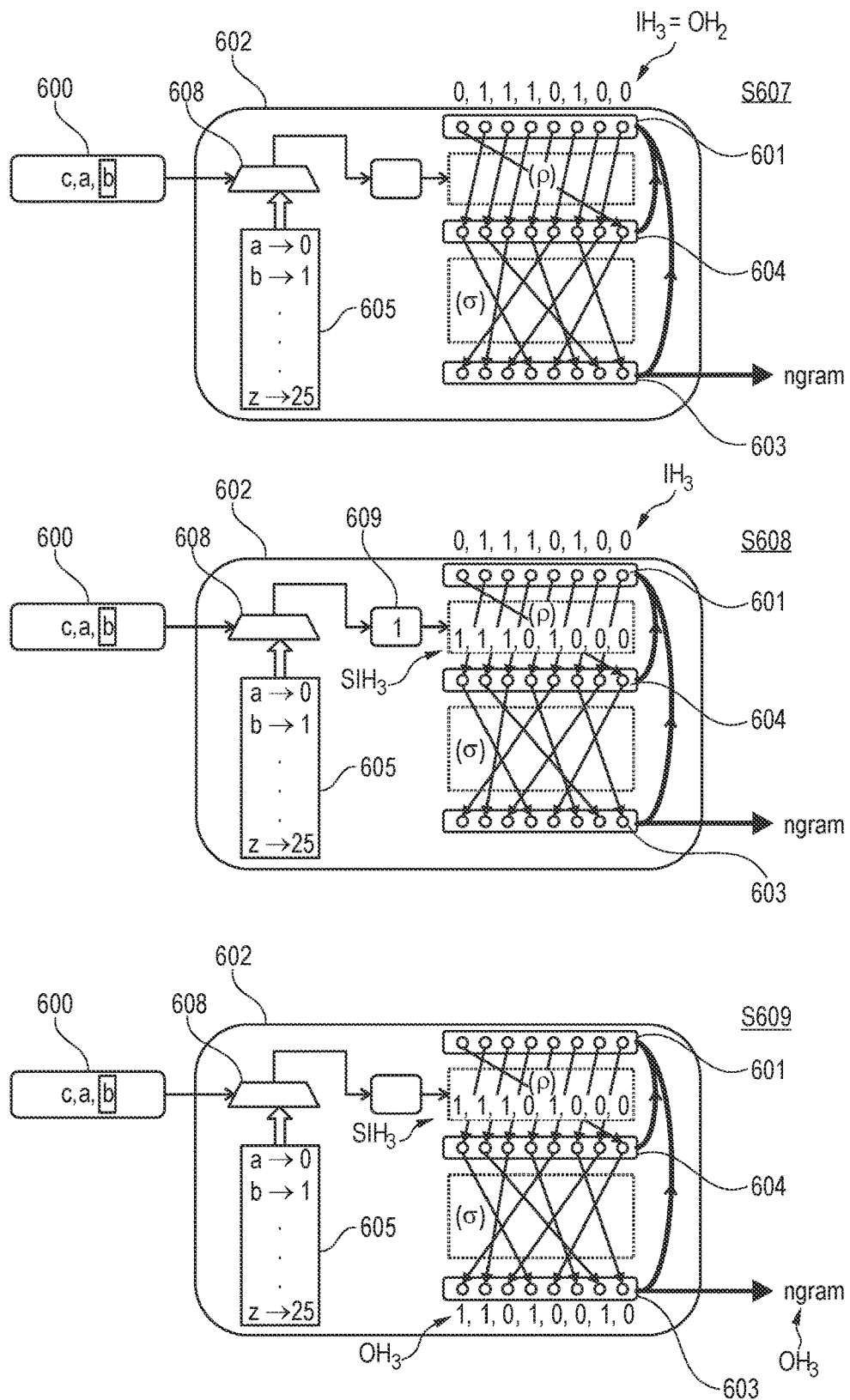

FIGS. 6A-6C shows block diagrams of a device 602 at different stages of processing an ordered group of three characters for representing the ordered group of characters with a hypervector of dimension D=8 in accordance with an example of the present invention.

At stage S601 (see FIG. 6A), the device 602 initializes the input memory 601 with a randomly initialized seed hypervector $IH_1$ which is the input hypervector associated with the first character "c". The output (i.e., ngram) is indicated at the output memory 603.

At stage S602, the device 602 uses the selector 608 to select from the lookup table 605 the integer number 609 which is associated with the character "c". This integer number 609 is two. This indicates to the device that the number of circular shift operations to be performed is two circular shift operations. These two circular shift operations are successively applied on the input hypervector $IH_1$ i.e., the first circular shift operation is performed on the input hypervector $IH_1$ resulting in an intermediated hypervector on which the second circular shift operation is performed. This may result in the shifted hypervector $SIH_1$ which is stored in the intermediate memory 604.

At stage S603, the device 602 applies the rotation operation on the shifted hypervector $SIH_1$. This may result in an output hypervector $OH_1$ that represents the character "c". Since the character "c" is not the last character of the ordered group of characters 600, the output hypervector $OH_1$ may be provided as an input hypervector associated with the subsequent character "a".

Hence, at stage S604 (see FIG. 6B), the device 602 stores in the input memory 601 the output hypervector $OH_1$ which is the input hypervector $IH_2$ associated with the second character "a".

At stage S605, the device 602 uses the selector 608 to select from the lookup table 605 the integer number 609 which is associated with the character "a". This integer number 609 is zero. This indicates to the device that no circular shift operation is to be performed. This may result in the shifted hypervector $SIH_2$ which is stored in the intermediate memory 604 and being the same as the input hypervector $IH_2$.

At stage S606, the device 602 applies the rotation operation on the shifted hypervector $SIH_2=IH_2$. This may result in an output hypervector $OH_2$ that represents the ordered group of characters "ca". Since the character "a" is not the last character of the ordered group of characters 600, the output hypervector $OH_2$ may be provided as an input hypervector associated with the subsequent character "b".

Hence, at stage S607 (see FIG. 6C), the device 602 stores in the input memory 601 output hypervector $OH_2$ which is the input hypervector $IH_3$ associated with the third character "b".

At stage S608, the device 602 uses the selector 608 to select from the lookup table 605 the integer number 609 which is associated with the character "b". This integer number 609 is one. This indicates to the device that the number of circular shift operations to be performed is one circular shift operation. The circular shift operation is performed on the input hypervector $IH_3$ resulting in a shifted hypervector $SIH_3$ which is stored in the intermediate memory 604.

At stage S609, the device 602 applies the rotation operation on the shifted hypervector $SIH_3$. This may result in an output hypervector $OH_3$ that represents the ordered group of characters "cab". Since the character "b" is the last character of the ordered group of characters 600, the output hypervector $OH_3$ may be provided as the hypervector that represents the ordered group of characters 600.

Figure 7A:
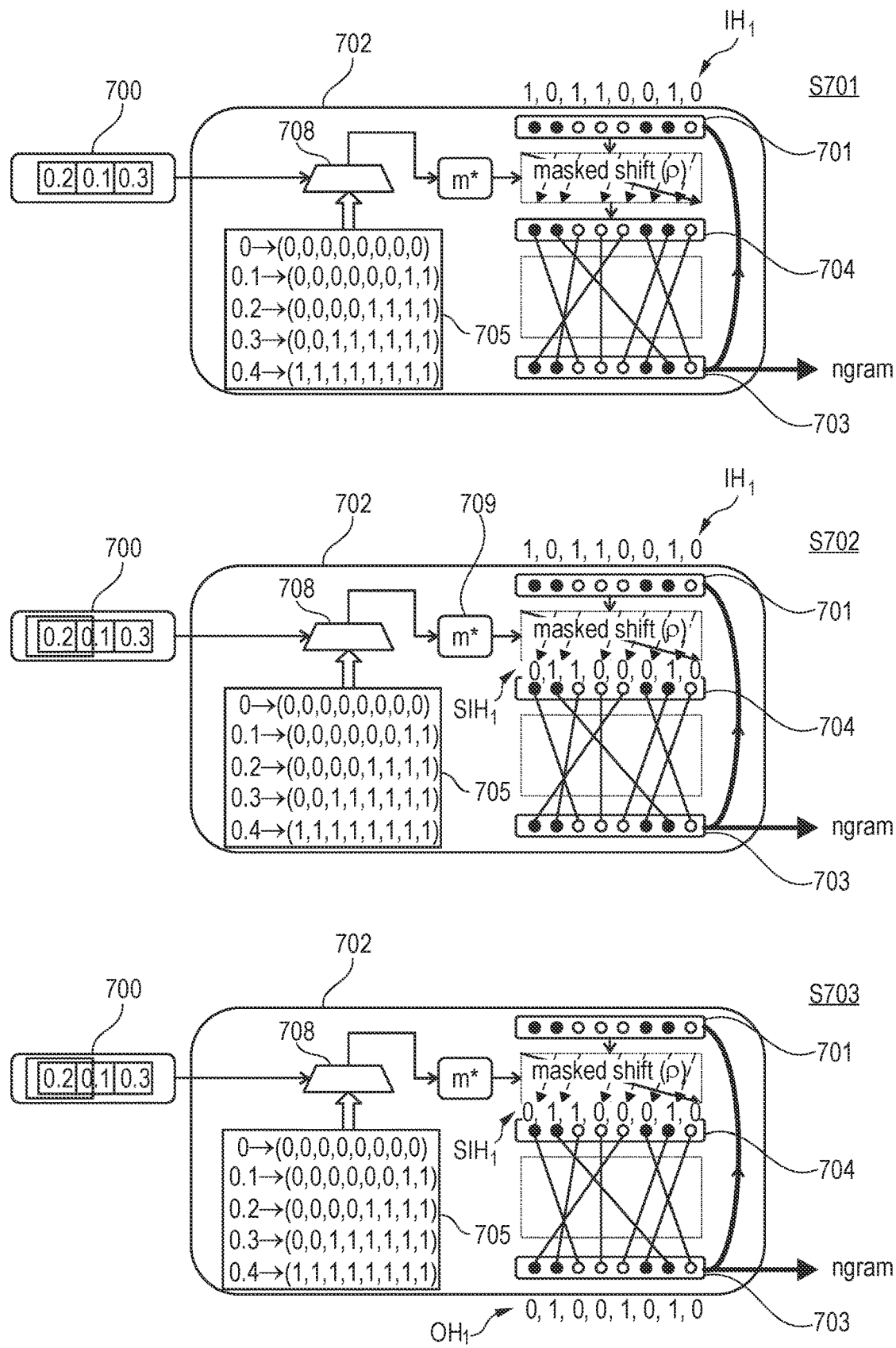
FIGS. 7A-7C shows block diagrams of a device at different stages of processing an ordered group of three numerical values for representing the ordered group of numerical values with a hypervector in accordance with an embodiment of the present invention.
Figure 7B:
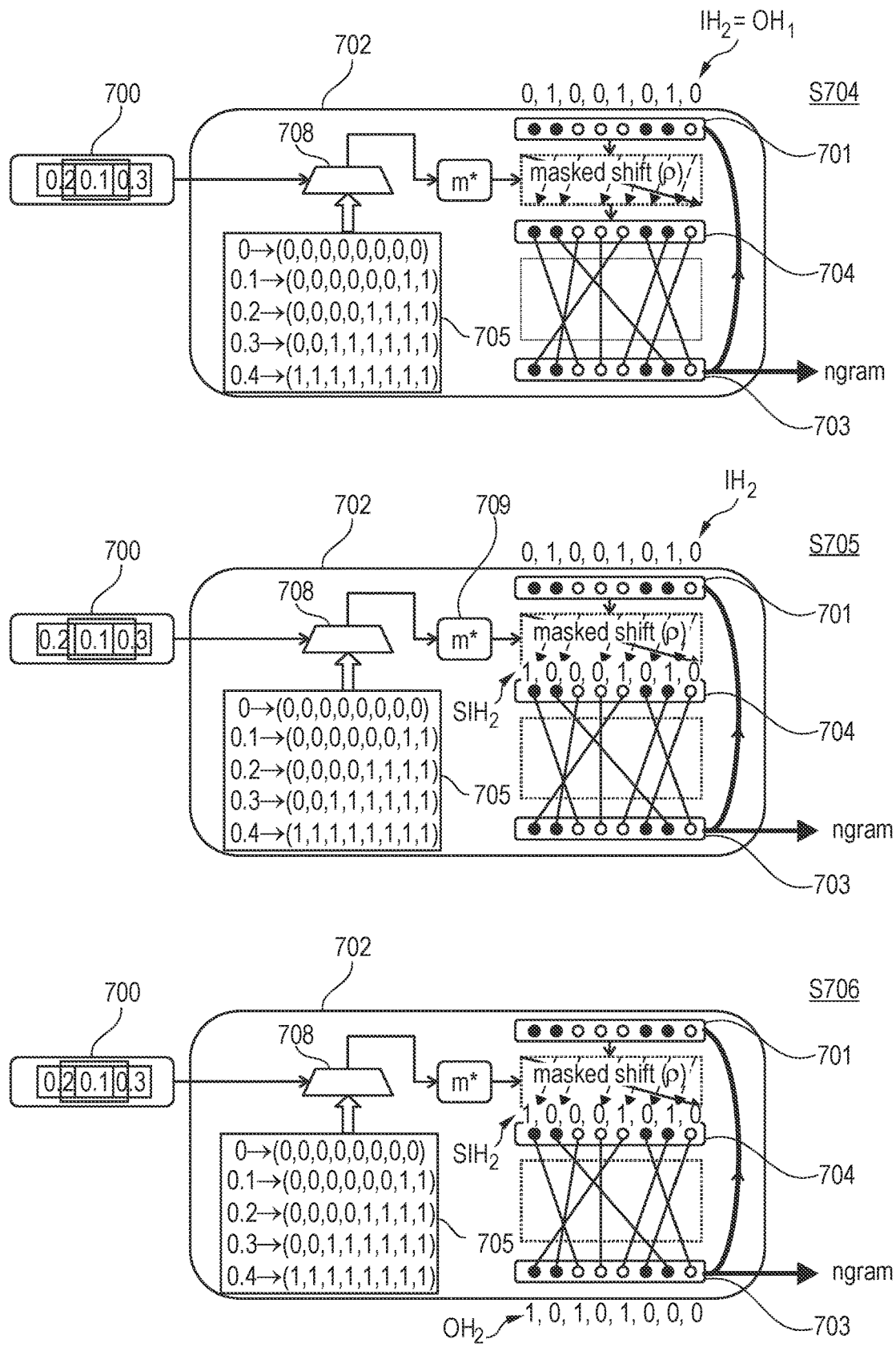
Figure 7C:
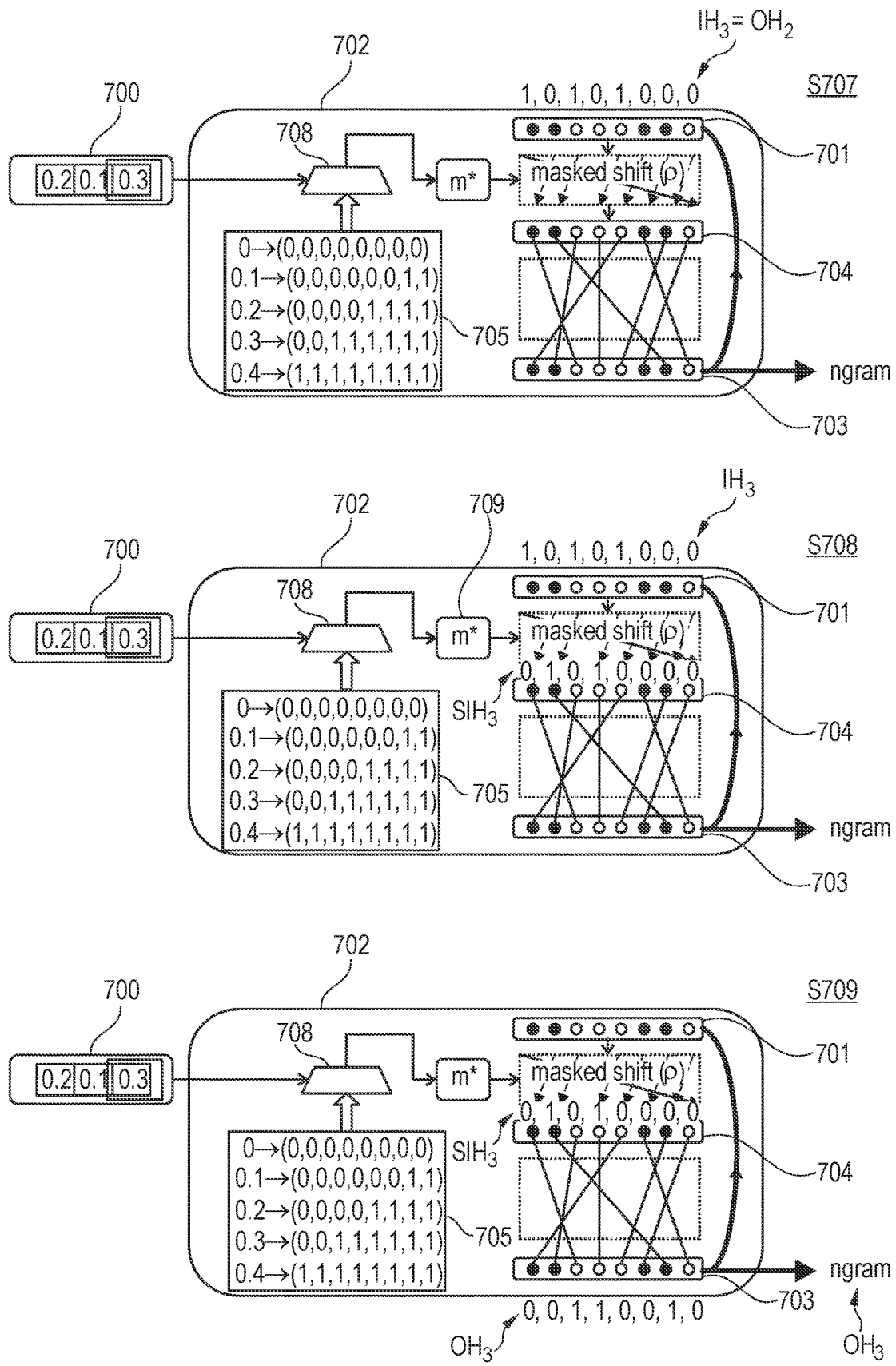

FIGS. 7A-7C shows a block diagrams of a device 702 at different stages of processing an ordered group of three numerical values for representing the ordered group of numerical values with a hypervector of dimension D=8 in accordance with an example of the present invention.

At stage S701 (see FIG. 7A), the device 702 initializes the input memory 701 with a randomly initialized seed hypervector $IH_1$ which is the input hypervector associated with the first numerical value "0.2". The output (i.e., ngram) is indicated at the output memory 703.

At stage S702, the device 702 uses the selector 708 to select from the lookup table 705 the masking vector 709 which is associated with the numerical value "0.2". The device 702 may apply the circular shift operation on the input hypervector $IH_1$ with the masking vector. Since the masking vector is applied, the circular shift operation is performed only on part of the bits of the input hypervector $IH_1$. This may result in the shifted hypervector $SIH_1$ which is stored in the intermediate memory 704.

At stage S703, the device 702 applies the rotation operation on the shifted hypervector $SIH_1$. This may result in an output hypervector $OH_1$ that represents the numerical value "0.2". Since the numerical value "0.2" is not the last numerical value of the ordered group of numerical values 700, the output hypervector $OH_1$ may be provided as an input hypervector associated with the subsequent numerical value "0.1".

Hence, at stage S704 (see FIG. 7B), the device 702 stores in the input memory 701 output hypervector $OH_1$ which is the input hypervector $IH_2$ associated with the second numerical value "0.1".

At stage S705, the device 602 uses the selector 608 to select from the lookup table 705 the masking vector 709 which is associated with the numerical value "0.1". The device 702 may apply the circular shift operation on the input hypervector $IH_1$ with the masking vector. Since the masking vector is applied, the circular shift operation is performed only on part of the bits of the input hypervector $IH_2$. This may result in the shifted hypervector $SIH_2$ which is stored in the intermediate memory 704.

At stage S706, the device 702 applies the rotation operation on the shifted hypervector $SIH_2$. This may result in an output hypervector $OH_2$ that represents the ordered group of numerical values "0.2 0.1". Since the numerical value "0.1" is not the last numerical value of the ordered group of numerical values 700, the output hypervector $OH_2$ may be provided as an input hypervector associated with the subsequent numerical value "0.3".

Hence, at stage S707 (see FIG. 7C), the device 702 stores in the input memory 701 output hypervector $OH_2$ which is the input hypervector $IH_3$ associated with the third numerical value "0.3".

At stage S708, the device 702 uses the selector 708 to select from the lookup table 705 the masking vector 709 which is associated with the numerical value "0.3". The device 702 may apply the circular shift operation on the input hypervector $IH_1$ with the masking vector. Since the masking vector is applied, the circular shift operation is performed only on part of the bits of the input hypervector $IH_3$. This may result in the shifted hypervector $SIH_3$ which is stored in the intermediate memory 704.

At stage S709, the device 702 applies the rotation operation on the shifted hypervector $SIH_3$. This may result in an output hypervector $OH_3$ that represents the ordered group of numerical values "0.20.10.3". Since the numerical value "0.3" is the last numerical value of the ordered group of numerical values 700, the output hypervector $OH_3$ may be provided as the hypervector that represents the ordered group of numerical values 700.

Figure 8:
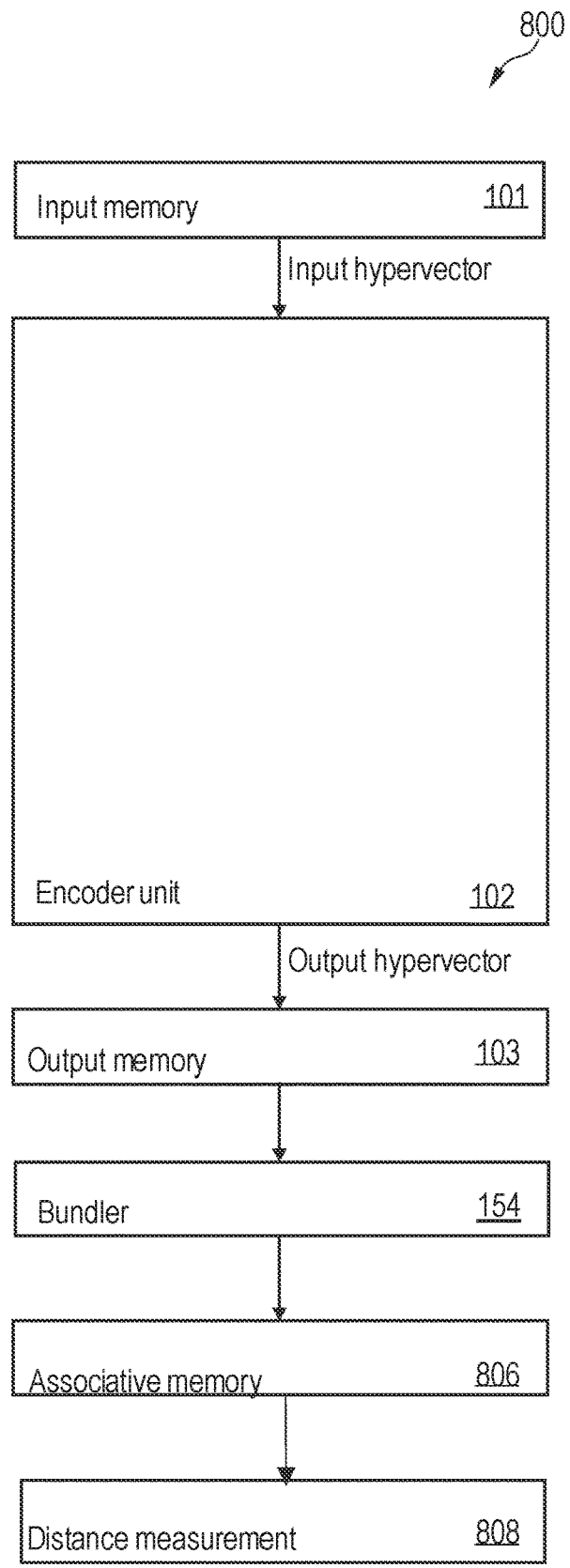
FIG. 8 shows a block diagram of a device for identifying similar ordered groups of symbols for a given ordered group of symbols in accordance with an embodiment of the present invention.

FIG. 8 shows a block diagram of a device 800 for identifying similar ordered groups of symbols for a given ordered group of symbols in accordance with an example of the present invention. The device 800 comprises the elements of the device 150 of FIG. 1B. In addition, the device 800 comprises an associative memory 806 that is configured for storing a plurality of profile hypervectors and for determining a distance between the hypervector that represents the given ordered group of symbols and the plurality of hypervectors. A related distance measurement unit 808 may be used for this distance measurement task. In one example, the associative memory 806 and the distance measurement unit 808 may be implemented by a crossbar array of memristive devices.

Figure 9:
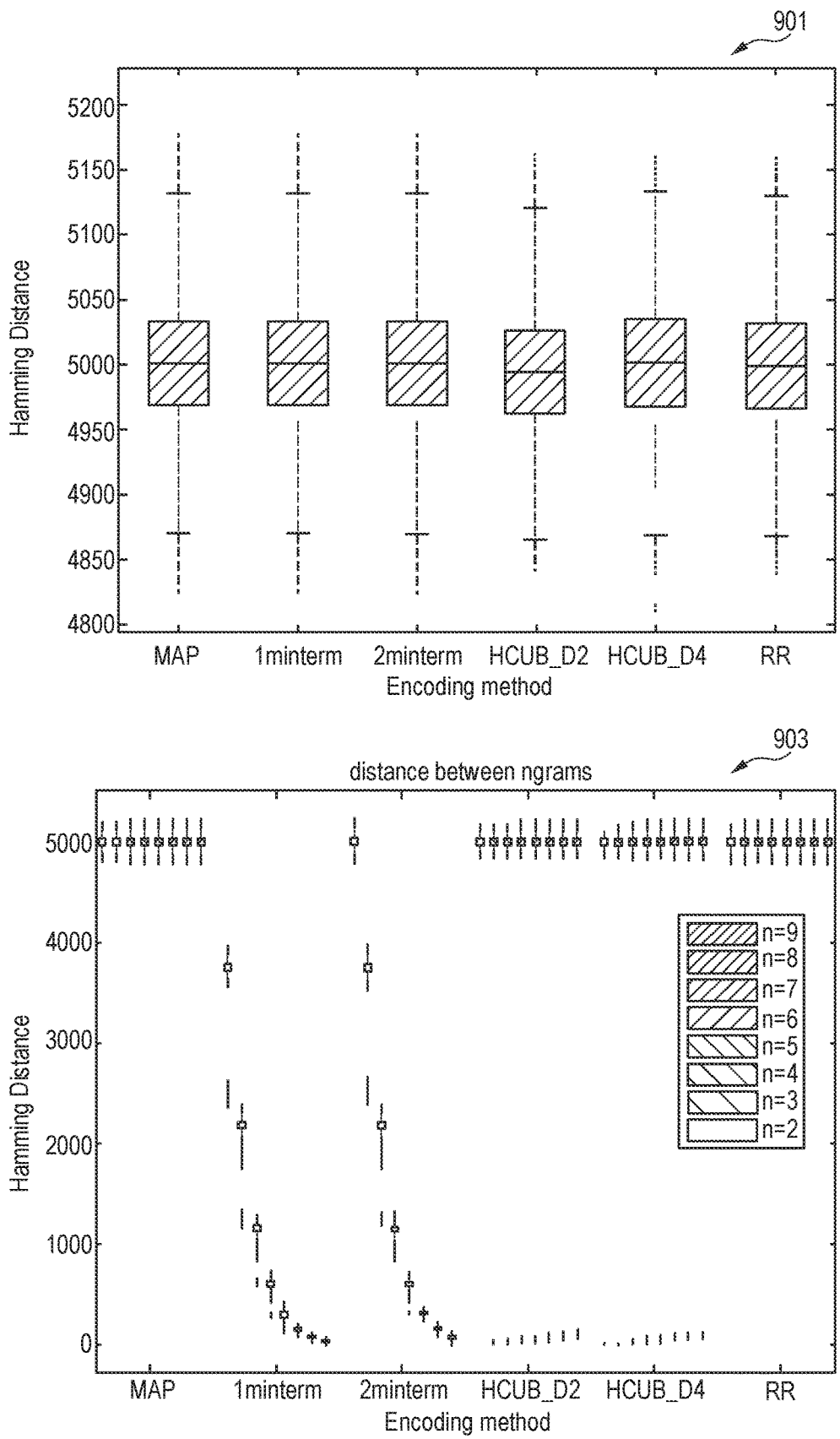
FIG. 9 shows plots of distance measurements between hypervectors according to an embodiment of the present invention.
Figure 9:
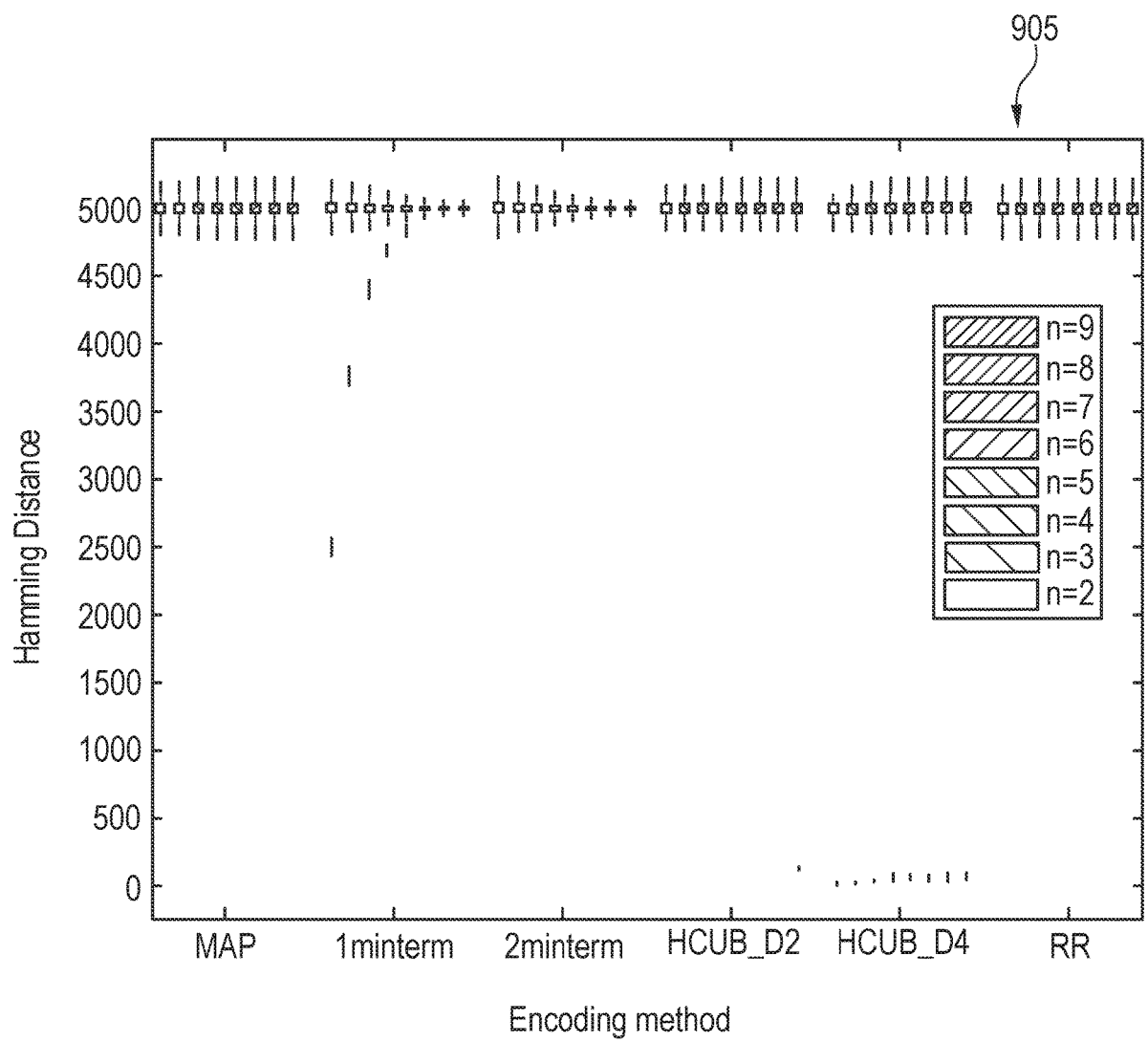

FIG. 9 shows example results of determining performances of the hypervectors generated according to the present invention. Using, for example, the method described in FIG. 6, hypervectors of dimension D=10000 may be generated for multiple n-grams, where n=2, . . . 9 e.g., a 10000-bit hypervector may be generated for the ordered group 'cab' 3-gram, in addition to other 3-gram hypervectors for other three-letter groups of symbols. Those generated hypervectors are compared with corresponding hypervectors generated for the same n-grams using other known encoding techniques such as HCUB_D2. The plots shown in FIG. 9 represent respectively the density of these generated hypervectors, the similarity (correlation) between pairs of generated hypervectors and the similarity from generated hypervectors to the initial seed hypervector and its permuted forms. In particular, in plot 901, the Hamming distance distributions between pairs of position encoded (up to 9 positions) dense basis hypervectors are compared against 6 different encoding schemes. HCUB_D2, HCUB_D4 and RR methods correspond to three different versions of permute-based encoding, HCUB_D2 and HCUB_D4 are structured rotate functions, whereas RR is a random rotate (RR) function. Alphabet size=27, D=10000. In plot 903, the Hamming distance distributions between pairs of n-grams are compared against 6 different encoding schemes for n-gram sizes 2 to 9. HCUB_D2, HCUB_D4 and RR methods correspond to 3 different versions of permute-based encoding. 1000 randomly selected n-grams are paired against each other at each n-gram size. Alphabet size=27, D=10000. The two-dimensional hypercube (HCUB_D2) and four-dimensional hypercube (HCUB_D4), both of which are structured permute based encoding methods, empirically reveal some n-gram pairs ending up with strong similarities. This is not visible in random rotate permute based encoding. In plot 905, the Hamming distance distributions between n-grams and permute-based encoding position encoded basis hypervectors are compared against 6 different encoding schemes for n-gram sizes 2 to 9. HCUB_D2, HCUB_D4 and RR methods correspond to 3 different versions of permute-based encoding. 1000 randomly selected n-grams are paired against all possible permute-based encoded basis hypervectors at each n-gram size. Alphabet size=27, D=10000. The four-dimensional hypercube (HCUB_D4) may empirically reveal some n-gram basis hypervector pairs ending up with strong similarities.

The present invention may further comprise the following clauses.

Clause 1. A device for encoding an ordered group of symbols, wherein the device comprises: an input storage configured for storing a randomly initialized seed hypervector; an encoding unit connected to the input storage configured for processing the ordered group of symbols sequentially starting from the first symbol using the stored seed hypervector as an input hypervector associated with the first symbol, the encoding unit being configured for the processing of each symbol of the ordered group of symbols for: applying on at least part of the input hypervector associated with the symbol a predefined number of circular shift operations associated with the symbol, resulting in a shifted hypervector; applying a rotate operation on the shifted hypervector, the applying resulting in an output hypervector, and if the symbol is not the last symbol of the ordered group of symbols storing the output hypervector in the input storage as the input hypervector associated with a subsequent symbol of the symbol; otherwise, providing the output hypervector of the last symbol of the ordered group of symbols as a hypervector that represents the ordered group of symbols.

Clause 2. The device of clause 1, the ordered group of symbols being an ordered group of characters of an initial set of characters, the encoding unit being configured to associate with each character of the initial set of characters an integer number higher than or equal to zero, wherein the predefined number of circular shift operations associated with the symbol is the integer number associated with the symbol, wherein the encoding unit is configured to apply the number of circular shift operations on all bits of the input hypervector.

Clause 3. The device of clause 2, the encoding unit comprising a lookup table configured for storing the characters and associated integer numbers, and a selector that is configured to receive a character of the ordered group of characters and to select the integer number associated with the character from the lookup table.

Clause 4. The device of clause 1, the ordered group of symbols being an ordered group of numerical values which are part of a set of numerical values, the encoding unit being configured to associate with each numerical value of the set of numerical values an indication of bits to be shifted, wherein the encoding unit is configured to apply the circular shift operation on the indicated bits of the input hypervector associated with the numerical value.

Clause 5. The device of clause 4, the encoding unit being configured to associate with each numerical value of the set of numerical values a masking vector indicative of the bits to be shifted, and to apply the circular shift operation with the masking vector associated with the numerical value so that it allows the shift operation of bits of the input hypervector which are indicated bits.

Clause 6. The device of clause 4 or 5, wherein the number of bits in which the shift is prevented is proportional to the numerical value.

Clause 7. The device of any of the preceding clauses 1 to 6, the encoding unit being configured to store the shifted hypervector in the input storage or in another storage of the device.

Clause 8. The device of any of the preceding clauses 1 to 7, the initial seed hypervector being a 50% or less dense binary equiprobable seed hypervector, preferably less than 1% dense binary seed hypervector.

Clause 9. The device of any of the preceding clauses 1 to 8, the ordered group of symbols being a group of a sequence of ordered groups of symbols, the device being further configured to generate further hypervectors that represent further ordered groups of symbols of the sequence respectively, the device further comprising a distance module configured for computing a distance between the hypervectors representing the sequence of ordered groups of symbols.

Clause 10. The device of any of the preceding clauses 1 to 9, the ordered group of symbols being a group of a sequence of ordered groups of symbols, the device being further configured to generate further hypervectors that represent further ordered groups of symbols of the sequence respectively, the device further comprising a bundler module configured for accumulating the hypervectors representing the sequence of ordered groups of symbols.

Figure 10:
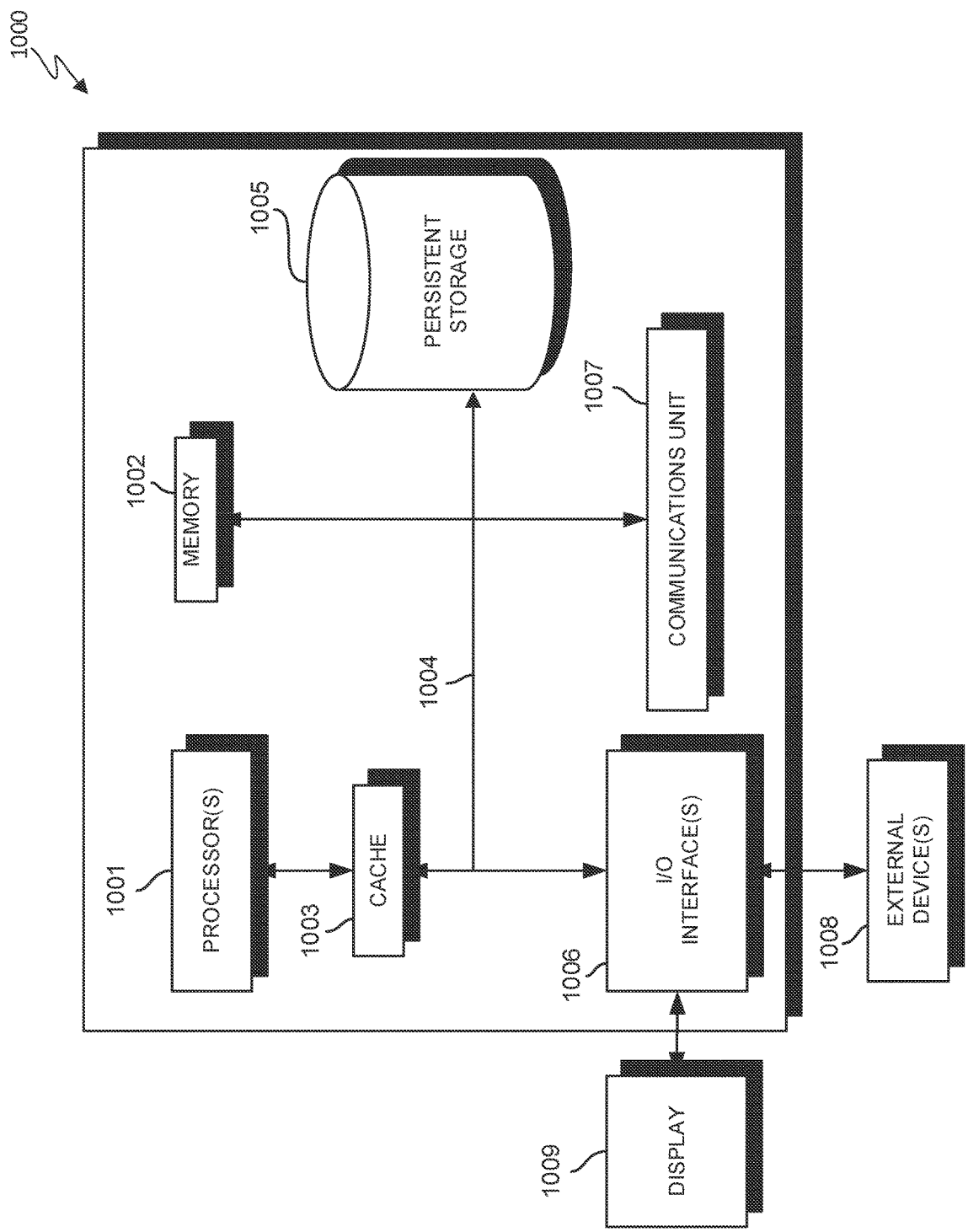
FIG. 10 depicts a block diagram, designated as 1000, of components of a server computer capable of executing process 500, of FIG. 5, in accordance with an embodiment of the present invention.

FIG. 10, designated as 1000, depicts a block diagram of components of a computer system executing process 500, in accordance with an illustrative embodiment of the present invention. It should be appreciated that FIG. 10 provides only an illustration of one implementation and does not imply any limitations with regard to the environments in which different embodiments may be implemented. Many modifications to the depicted environment may be made.

FIG. 10 includes processor(s) 1001, cache 1003, memory 1002, persistent storage 1005, communications unit 1007, input/output (I/O) interface(s) 1006, and communications fabric 1004. Communications fabric 1004 provides communications between cache 1003, memory 1002, persistent storage 1005, communications unit 1007, and input/output (I/O) interface(s) 1006. Communications fabric 1004 can be implemented with any architecture designed for passing data and/or control information between processors (such as microprocessors, communications and network processors, etc.), system memory, peripheral devices, and any other hardware components within a system. For example, communications fabric 1004 can be implemented with one or more buses or a crossbar switch.

Memory 1002 and persistent storage 1005 are computer readable storage media. In this embodiment, memory 1002 includes random access memory (RAM). In general, memory 1002 can include any suitable volatile or non-volatile computer readable storage media. Cache 1003 is a fast memory that enhances the performance of processor(s) 1001 by holding recently accessed data, and data near recently accessed data, from memory 1002.

Program instructions and data (e.g., software and data x10) used to practice embodiments of the present invention may be stored in persistent storage 1005 and in memory 1002 for execution by one or more of the respective processor(s) 1001 via cache 1003. In an embodiment, persistent storage 1005 includes a magnetic hard disk drive. Alternatively, or in addition to a magnetic hard disk drive, persistent storage 1005 can include a solid state hard drive, a semiconductor storage device, a read-only memory (ROM), an erasable programmable read-only memory (EPROM), a flash memory, or any other computer readable storage media that is capable of storing program instructions or digital information.

The media used by persistent storage 1005 may also be removable. For example, a removable hard drive may be used for persistent storage 1005. Other examples include optical and magnetic disks, thumb drives, and smart cards that are inserted into a drive for transfer onto another computer readable storage medium that is also part of persistent storage 1005. Process 500 can be stored in persistent storage 1005 for access and/or execution by one or more of the respective processor(s) 1001 via cache 1003.

Communications unit 1007, in these examples, provides for communications with other data processing systems or devices. In these examples, communications unit 1007 includes one or more network interface cards. Communications unit 1007 may provide communications through the use of either or both physical and wireless communications links. Program instructions and data (e.g., process 500) used to practice embodiments of the present invention may be downloaded to persistent storage 1005 through communications unit 1007.

I/O interface(s) 1006 allows for input and output of data with other devices that may be connected to each computer system. For example, I/O interface(s) 1006 may provide a connection to external device(s) 1008, such as a keyboard, a keypad, a touch screen, and/or some other suitable input device. External device(s) 1008 can also include portable computer readable storage media, such as, for example, thumb drives, portable optical or magnetic disks, and memory cards. Program instructions and data (e.g., process 500) used to practice embodiments of the present invention can be stored on such portable computer readable storage media and can be loaded onto persistent storage 1005 via I/O interface(s) 1006. I/O interface(s) 1006 also connect to display 1009.

Display 1009 provides a mechanism to display data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A device for encoding an ordered group of symbols, wherein the device comprises:
    an input storage configured for storing a randomly initialized seed hypervector; and
    an encoding unit connected to the input storage configured for processing the ordered group of symbols sequentially starting from the first symbol using the stored seed hypervector as an input hypervector associated with the first symbol, the encoding unit being configured for the processing of each symbol of the ordered group of symbols for:
        applying on at least part of the input hypervector associated with the symbol a predefined number of circular shift operations associated with the symbol, resulting in a shifted hypervector;
        applying a rotate operation on the shifted hypervector, the applying resulting in an output hypervector, and
        if the symbol is not the last symbol of the ordered group of symbols storing the output hypervector in the input storage as the input hypervector associated with a subsequent symbol of the symbol; otherwise, providing the output hypervector of the last symbol of the ordered group of symbols as a hypervector that represents the ordered group of symbols.

2. The device of claim 1, the ordered group of symbols being an ordered group of characters of an initial set of characters, the encoding unit being configured to associate with each character of the initial set of characters an integer number higher than or equal to zero, wherein the predefined number of circular shift operations associated with the symbol is the integer number associated with the symbol, wherein the encoding unit is configured to apply the number of circular shift operations on all bits of the input hypervector.

3. The device of claim 2, the encoding unit comprising a lookup table configured for storing the characters and associated integer numbers, and a selector that is configured to receive a character of the ordered group of characters and to select the integer number associated with the character from the lookup table.

4. The device of claim 1, the ordered group of symbols being an ordered group of numerical values which are part of a set of numerical values, the encoding unit being configured to associate with each numerical value of the set of numerical values an indication of bits to be shifted, wherein the encoding unit is configured to apply the circular shift operation on the indicated bits of the input hypervector associated with the numerical value.

5. The device of claim 4, the encoding unit being configured to associate with each numerical value of the set of numerical values a masking vector indicative of the bits to be shifted, and to apply the circular shift operation with the masking vector associated with the numerical value so that it allows the shift operation of bits of the input hypervector which are the indicated bits.

6. The device of claim 5, wherein the number of bits in which the shift is prevented is proportional to the numerical value.

7. The device of claim 1, the encoding unit being configured to store the shifted hypervector in the input storage or in another storage of the device.

8. The device of claim 1, the initial seed hypervector being a 50% or less dense binary equiprobable seed hypervector, preferably less than 1% dense binary seed hypervector.

9. The device of claim 1, the ordered group of symbols being a group of a sequence of ordered groups of symbols, the device being further configured to generate further hypervectors that represent further ordered groups of symbols of the sequence respectively, the device further comprising a distance module configured for computing a distance between the hypervectors representing the sequence of ordered groups of symbols.

10. The device of claim 1, the ordered group of symbols being a group of a sequence of ordered groups of symbols, the device being further configured to generate further hypervectors that represent further ordered groups of symbols of the sequence respectively, the device further comprising a bundler module configured for accumulating the hypervectors representing the sequence of ordered groups of symbols.

11. A system, the system comprising:
    one or more computer processors;
    one or more computer readable storage media;
    one or more devices with the one or more computer processors and the one or more computer readable storage medias;
    the one or more devices with an input storage configured for storing a randomly initialized seed hypervector; and
    an encoding unit within the one or more devices connected to the input storage configured for processing the ordered group of symbols sequentially starting from the first symbol using the stored seed hypervector as an input hypervector associated with the first symbol, the encoding unit being configured for the processing of each symbol of the ordered group of symbols for:
        applying on at least part of the input hypervector associated with the symbol a predefined number of circular shift operations associated with the symbol, resulting in a shifted hypervector;
        applying a rotate operation on the shifted hypervector, the applying resulting in an output hypervector, and
        if the symbol is not the last symbol of the ordered group of symbols storing the output hypervector in the input storage as the input hypervector associated with a subsequent symbol of the symbol; otherwise, providing the output hypervector of the last symbol of the ordered group of symbols as a hypervector that represents the ordered group of symbols.

12. The system of claim 11, further comprising an adder unit configured for adding the respective hypervectors of the one or more devices.

13. The system of claim 11, wherein the one or more devices are configured to operate in parallel on respective ordered groups of symbols.

14. A method for encoding an ordered group of symbols, the method comprising:
providing a randomly initialized seed hypervector; and
processing the ordered group of symbols sequentially starting from a first symbol of the ordered group using the stored seed hypervector as an input hypervector associated with the first symbol, the processing of each symbol comprising:
applying on at least part of the input hypervector associated with the symbol a predefined number of circular shift operations associated with the symbol, resulting in a shifted hypervector;
applying a rotate operation on the shifted hypervector, the applying resulting in an output hypervector,
if the symbol is not the last symbol of the ordered group of symbols providing the output hypervector as the input hypervector associated with a subsequent symbol of the symbol; and
otherwise, providing the output hypervector of the last symbol of the ordered group of symbols as a hypervector that represents the ordered group of symbols.

15. The method of claim 14, the ordered group of symbols being a subset of characters of an initial set of characters, the method further comprising:
associating with each character of the initial set of characters an integer number higher than or equal to zero, wherein the predefined number of circular shift operations is the integer number, wherein the applying of the number of circular shift operations is performed on all bits of the input hypervector.

16. The method of claim 14, the ordered group of symbols being a sequence of numerical values, the method further comprising:
associating with each numerical value of a set of numerical values a predefined number of bits to be shifted, wherein the applying of the circular shift operation is performed on the predefined number of bits of the input hypervector associated with the symbol.

17. The method of claim 14, the initial seed hypervector being a 50% or less dense binary equiprobable seed hypervector, preferably less than 1% dense binary seed hypervector.

18. The method of claim 14, further comprising repeating the method for encoding further ordered groups of symbols, resulting in hypervectors that represent the further ordered groups of symbols.

19. The method of claim 18, further comprising accumulating the hypervectors using a bundler module.

20. The method of claim 18, further comprising computing a distance between the hypervectors representing the ordered groups of symbols using a distance module.

* * * * *